United States Patent [19]

Karamon et al.

[11] Patent Number: 4,623,408

[45] Date of Patent: Nov. 18, 1986

[54] NITROGEN-CONTAINING AMORPHOUS ALLOY

[75] Inventors: Hideaki Karamon, Sendai; Keiichi Ogawa, Tokyo, both of Japan

[73] Assignees: Hideaki Karamon, Sendai; Research Development Corporation of Japan, Tokyo, both of Japan

[21] Appl. No.: 691,827

[22] Filed: Jan. 16, 1985

[30] Foreign Application Priority Data

Jan. 20, 1984 [JP] Japan .................................. 59-7319

[51] Int. Cl.⁴ .............................................. C22C 1/10
[52] U.S. Cl. .................................. 148/403; 148/304; 204/192.12; 420/425; 420/429; 420/901; 420/92; 420/121; 420/122; 420/123; 420/125; 420/126; 420/128
[58] Field of Search ............................ 148/403, 31.55; 420/425, 429, 901; 75/123 B; 204/192 R

[56] References Cited

U.S. PATENT DOCUMENTS 4,231,816 11/1980 Cuomo et al. ...................... 148/403

4,264,358 4/1981 Johnson et al. ...................... 420/901

Primary Examiner—L. Dewayne Rutledge
Assistant Examiner—Robert L. McDowell
Attorney, Agent, or Firm—Flynn, Thiel, Boutell & Tanis

[57] ABSTRACT

Nitrogen-containing amorphous alloys having a combination of superior properties which are highly valuable and desirable for ferromagnetic materials or superconducting materials are produced by sputtering metallic materials and nitrogen compounds containing semimetal or semiconducting metal, such as boron or silicon, without requiring the use of nitrogen gas. The produced alloy has a novel structure, represented by the formula:

$$M_x L_y N_z$$

(wherein M is at least one metal or alloy; L is at least one semimetal or semiconducting element; and x, y and z are fractional atomic percentages totaling 100 (i.e., $x+y+z=100$) and the value of $y+z$ being 10 or more and the respective values of x, y, z being not zero).

11 Claims, 19 Drawing Figures

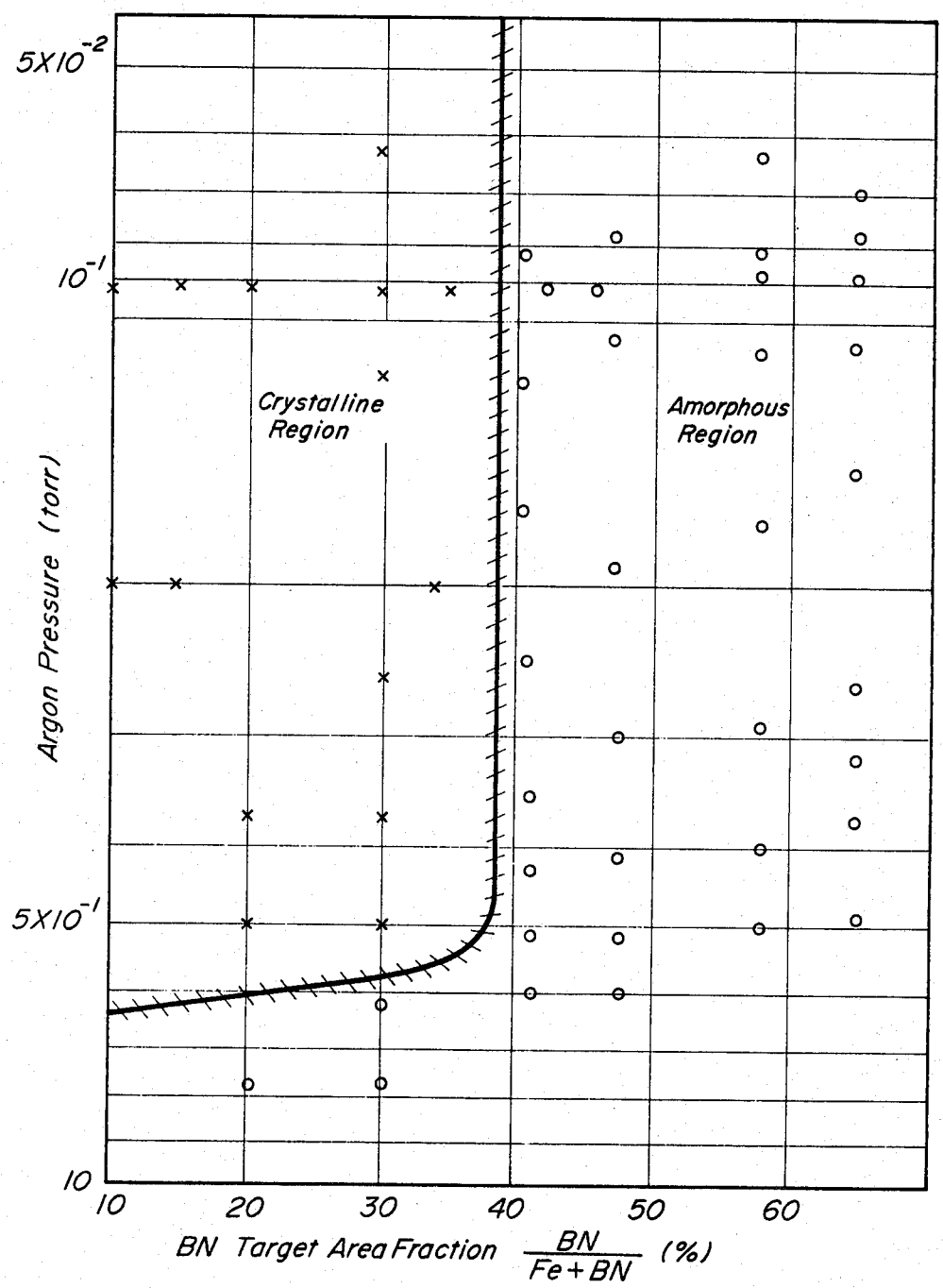

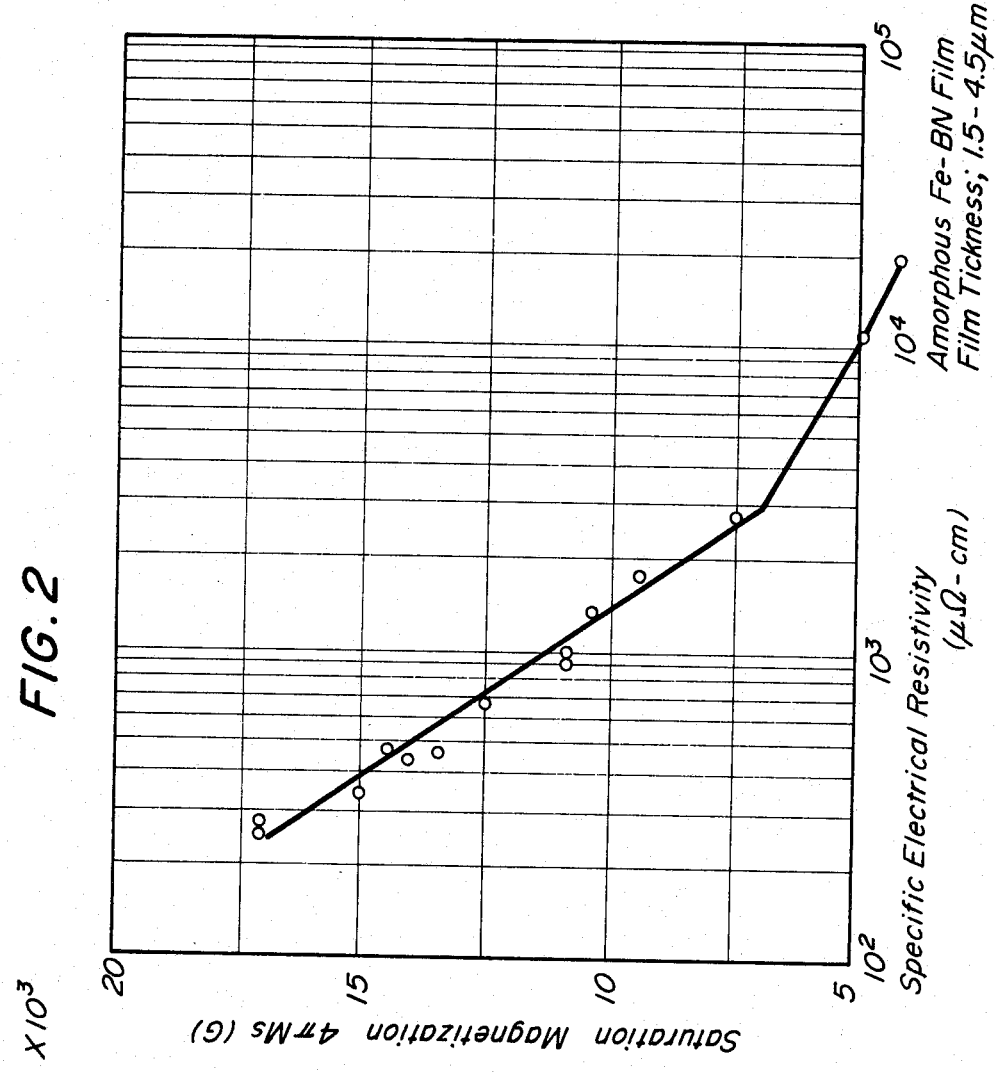

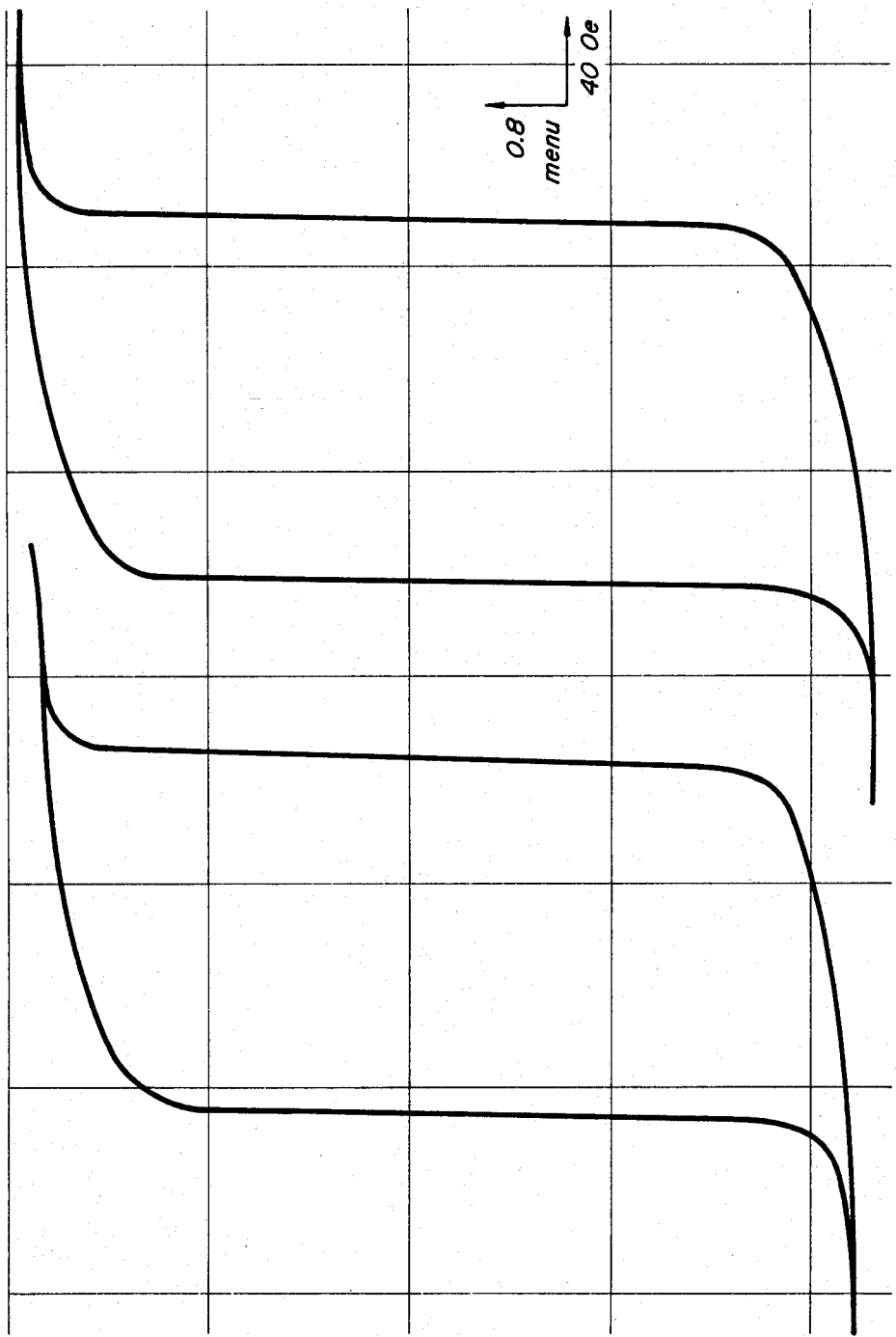

30°   40°   50°
2θ

0.1 μm 0.1 mm

NITROGEN-CONTAINING AMORPHOUS ALLOY

BACKGROUND OF THE INVENTION

The present invention relates to nitrogen containing amorphous alloys and more particularly to novel nitrogen-containing amorphous alloys having a combination of superior properties as ferromagnetic materials or superconductors.

It has been known that amorphous alloys mainly composed of metal, such as Fe, Ni or Co, and semimetal or semiconducting element, such as B or Si, are superior, particularly in magnetic properties, mechanical strength, corrosion resistance, and, thus, the amorphous alloys have been greatly expected as hopeful materials in various applications, for example, as magnetic materials, electronic materials and composite materials. In response to such great expectation and demand, several methods have been developed and proposed in the production of the amorphous alloys by utilizing various combinations of alloying elements, vacuum evaporation, plating, liquid quenching etc. Among these earlier methods, for example, nitrogen-bearing alloys are disclosed in Japanese Patent Application Laid-Open Nos. 51-12310 and 54-94428.

In the former patent application, nitrogen-containing amorphous alloys are produced by melting metal in a gas atmosphere and incorporating nitrogen gas into the molten metals. In this method, amounts of nitrogen added to the alloys are at most a level of 2% and further addition could not be expected.

On the other hand, the latter produces nitrogen-containing amorphous alloys by sputtering in a chamber where plasma containing nitrogen gas of at least 2% in volume percentage is generated and nitrogen can be incorporated into the resulting alloys in appreciable amounts of 1 atomic % or more. However, in this method, it is very difficult to control so as to steadily incorporate desired large quantities of nitrogen into the alloys, since nitrogen gas is active and makes the sputtering process unstable. Further, the latter method necessitates using alloy targets which have compositions themselves capable of developing amorphous alloys and, thus, the compositions of the produced amorphous alloys are determined exclusively only by the compositions of the used alloy targets. Therefore, when other alloys with different compositions are requested, it is necessary to replace alloy targets depending upon the desired compositions, and this troublesome replacement makes the production process more complicated.

BRIEF SUMMMARY OF THE INVENTION

It is therefore a primary object of the present invention to readily provide amorphous alloys containing nitrogen in a high content and having a novel structure which are particularly useful as ferromagnetic materials and superconductive materials.

Another object of the present invention is to produce the useful amorphous alloys without using nitrogen gas, whereby eliminating the problems and disadvantages encountered in the production method using nitrogen gas.

According to the present invention, there are produced amorphous alloys having the general formula specified hereinafter, using a target composed of at least one metallic material and at least one nitrogen compound of semi-metal or semiconducting element and the produced amorphous alloys exhibit unexpectedly superior properties which make the produced alloys highly valuable as ferromagnetic materials or superconducting materials.

BRIEF DESCRIPTION OF THE DRAWINGS

FIG. 1 is a graph showing amorphous and crystalline regions related to the relationship between BN target area fraction in the total area of Fe and BN targets and an argon pressure;

FIG. 2 is a graph showing the relationship between specific electrical resistivity and saturation magnetization for a Fe-BN amorphous film;

FIGS. 3(a) and 3(b) are transmission electron micrographs of an amorphous film wherein FIG. 3(a) is a bright field image and FIG. 3(b) is a dark field image;

FIGS. 4(a) and 4(b) are graphs showing the relationships of the Fe atomic % in Fe-BN and squareness ratio;

DETAILED DESCRIPTION OF THE PREFERRED EMBODIMENTS

Figure 3A:
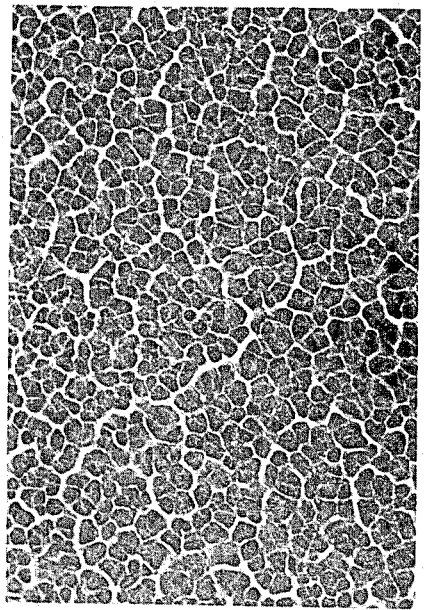

The present invention resides in novel amorphous alloys with a high nitrogen content represented by the general formula:

$M_xL_yN_z$ wherein
M is at least one metal;
L is at least one semimetal or semiconducting element for example B or Si; and
x, y and z are fractional atomic percentages totaling 100 (i.e., $x+y+z=100$) and the value of $y+z$ being 10 or more and the respective values of x, y, z being not zero.

A further characteristic of the present invention is that the foregoing amorphous alloys can be produced by sputtering using at least one metallic material of M in the general formula specified above and at least one nitrogen compound of semimetal or semiconducting element as a target without requiring the use of nitrogen gas.

Where the alloys of the present invention are used as ferromagnetic materials, M in the foregoing formula is preferably at least one element selected from the group consisting of the transition metals in Group 3d of the Periodic Table, i.e., Fe, Co and Ni, and alloys of these transition metals and one or more other metals, for example, Sc, Ti, V, Cr, Mn, W, Mo, Ta, Nb, Zr, Cu, Ag, Au, etc.

On the other hand, in applications as superconducting materials, it is preferred that M be at least one element selected from the group consisting of the transition metals in Group 4d, i.e., Y, Zr, Nb, Mo, Tc, Ru, Rh and Pd, and alloys of these metals and one or more other metals, for example, W, Re and Os.

Semi-metals or semiconducting elements, such as B or Si, are used for developing the aimed amorphous structure in the resulted alloys.

Nitrogen is added to improve magnetic properties, corrosion resistance and mechanical properties of the resulting alloys and, further, increases their specific electrical resistivity.

In the general formula of the present invention, $y+z$ is required to be 10 or more. When $y+z$ is less than 10, the amorphous alloys contemplated by the present invention can not be obtained. The value of z in the formula is preferably 5 or more and the upper limit of y is desirably 50.

In accordance with the present invention, the amorphous alloys set forth above are produced by means of sputtering using a target made up of square-shaped plates of nitrogen compounds containing B or Si which are placed on a metallic disk of M in the above general formula. Further, other nitrogen compounds containing Al, Ga, In, C and Ge can be also used besides the B- or Si-containing nitrogen compounds.

In the present invention, by sputtering the nitrogen compounds set forth above as a part of a target to be sputtered, there are readily obtained alloy films having a novel amorphous structure and various superior properties which can not be obtained in the nitrogen-bearing amorphous alloy films produced by prior art, for example reactive sputtering method requiring the introduction of nitrogen gas into sputtering atmosphere.

The amorphous alloys containing 3d transition metals and 4d transition metals according to the present invention will be now separately described in detail.

Figure 3B:

Firstly, amorphous alloys containing at least one of the transition metals of Group 3d as a main alloying element are very useful as ferromagnetic materials and, as for example, Fe-BN amorphous alloys are produced by sputtering process in an argon atmosphere using Fe and BN as targets. The relationship between the BN target area fraction (%) in the Fe plate target plus the BN plate target (BN/Fe+BN) and argon gas pressure is shown in FIG. 1. The relationship between saturation magnetization and specific electrical resistivity for the amorphous Fe-BN was examined and shown in FIG. 2. As is clear from FIG. 2, when Fe atomic % is nearly 40%, the Fe-BN amorphous alloy was found to have a very high specific electric resistivity of $10^4 \mu\Omega$-cm which is a level beyond ten times the maximum specific electrical resistivity shown in FIG. 3 of Japanese Patent Application Laid-Open No. 54-94 428 set forth above. The fact proves that the amorphous alloys of the present invention have a novel structure which can not be obtained by the reactive sputtering process.

The new amorphous film structure can be assumed to be a mixed structure of two phase system composed of a first region of Fe base amorphous phase having a small specific resistivity surrounded by a second region of BN amorphous phase having a high specific electrical resistivity. This assumption is also supported by a bright field image, shown in FIG. 3(a), and a dark field image, shown in FIG. 3(b), by transmission electron microscopy.

Figure 4B:
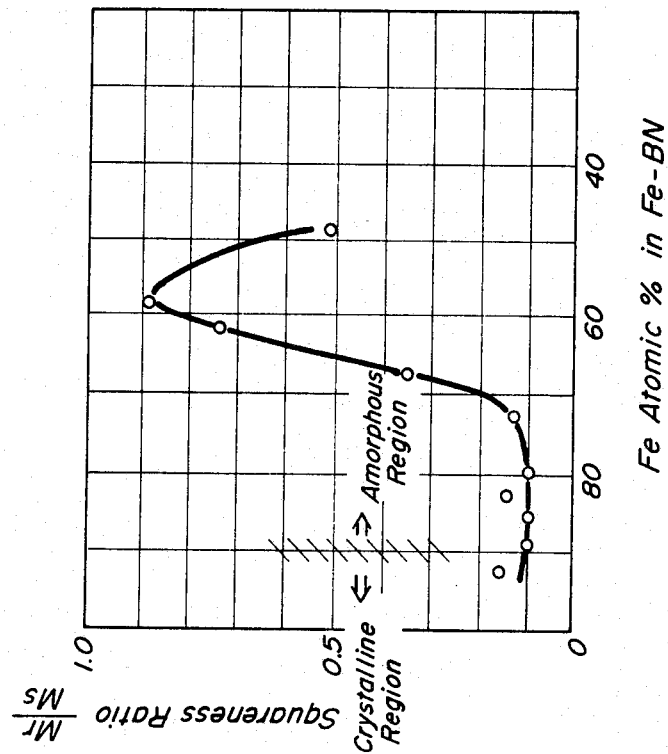

Further, the new structure is also revealed in the change in squareness ratio due to the compositional change, shown in FIG. 4(b), for the hysteresis loop of Fe-BN shown in FIG. 4(a). The isotropic property and a very high squareness ratio exceeding 90% achieved by the present invention are entirely unexpected magnetic properties over any usual film structure and such magnetic properties have not been reported up to date in reactive sputtering process.

Hereinafter, the ferromagnetic materials will be described in detail with reference to the example.

EXAMPLE 1

In the following, $Fe_xB_yN_z$ amorphous film ($x+y+z=100$) were produced by RF sputtering process.

Firstly, an Fe disc 80 mm in diameter and 5 mm thick was prepared as a target to be sputtered and the required number of 2 mm thick BN sintered plates cut into a size of 5 mm×5 mm were placed on the Fe target. A quartz glass or the other glasses were utilized as a substrate.

Sputtering conditions except for argon pressure and the area fractions of the BN plate targets were adjusted as follows and amorphous films were formed on the substrate.

Anode Voltage: 1.2 kV
Anodic Current: 90 mA
R.F. Power: 80 W
Degree of Initial Vacuum: $5\times10^{-7}$ to $8\times10^{-7}$ torr.
Distance between Electrodes: 40 mm
Pre-sputtering Time: 2 hours
Sputtering Time: up to 5 hours.

Sputtered films were classified into amorphous or crystalline by X-ray diffraction and the results of the classfication are shown in FIG. 1. As will be seen from FIG. 1, in the range of argon pressures below $5\times10^{-1}$ torr., the 38% line of the area fraction of the BN plates is a borderline between the crystalline region and the amorphous region.

The compositions of the produced films were analyzed by AES and XMA and it was found that the aforesaid area fraction line of 38% is corresponds to the composition of $X=90$ and $y+z=10$.

Further, in the region of argon pressures above $5\times10^{-1}$ torr, sputtering could not be steadily carried out and the critical line between crystalline and amorphous structures became a curved line. However, the value of x and $y+z$ in the critical composition were 90 and 10, respectively, as in the above case.

Figure 5:
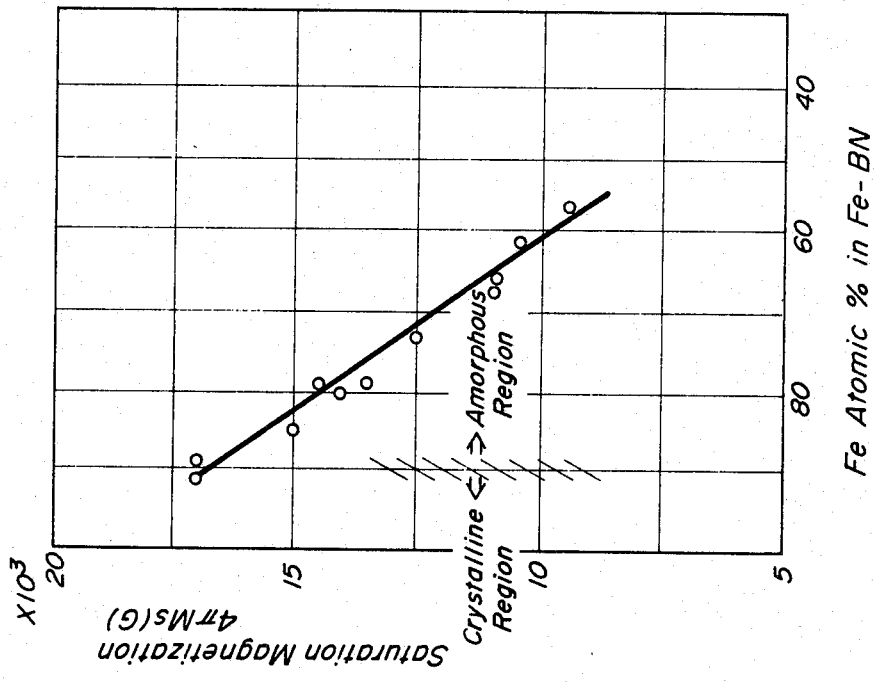
FIG. 5 is a graph showing the relationship of Fe atomic % in Fe-BN and saturation magnetization.
Figure 6:
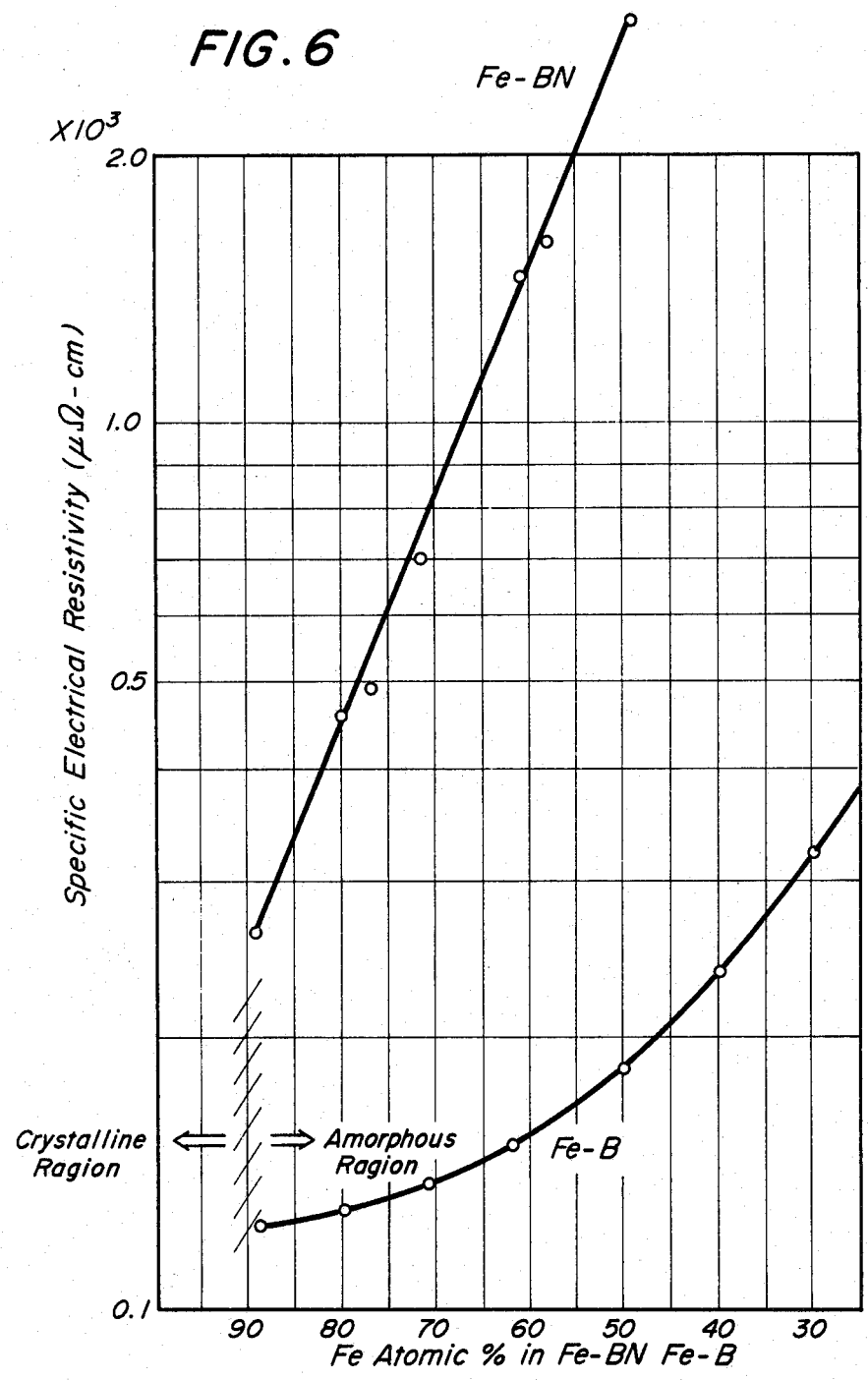
FIG. 6 is a graph showing the relationship of Fe atomic % in Fe-BN and Fe-B and specific electrical resistivity.

FIG. 5 shows the relationship between saturation magnetization at room temperature and atomic % of Fe for the amorphous region of Fe-BN films. Further, FIG. 6 shows the relationship between specific electrical resistivity and Fe atomic % for the amorphous region of the Fe-BN films.

It can be readily understood from these figures that characteristics of the materials of the present invention reside in their high saturation magnetization and very high specific electrical resistivity. Further, as is clear from FIGS. 4(a) and 4(b), the present invention could be realized in the composition region in which the squareness ratio of the hysteresis loop is isotropic and greater than 90%. Generally, although there have been heretofore known ferromagnetic materials having a high squareness ratio only in the direction of the easy axis of magnetization, ferromagnetic materials having an isotropic hysteresis loop and high squareness ratio in all directions have not been known up to now, except for the materials composed of dispersion of fine particles having multieasy axis crystal magnetic anisotropy. Of course, such a very high level of squareness ratio has not been reported in known amorphous magnetic materials without crystal magnetic anisotropy. It was found from the various experimental data given in detail in the above example that the amorphous alloys according to the present invention exhibit extremely superior properties as ferromagnetic materials. Further, the above Fe-BN films of the present invention were not changed magnetically and chemically after leaving them for a half year at room temperature.

Although, in the above example, BN was employed as a nitrogen compound, SiN or other nitrogen compounds of Al, Ga, In, C or Ge can be similarly employed and the same superior results as in the case of using BN can be obtained.

Example of superconductors will now be described in detail hereinbelow.

EXAMPLE 2

In the following, $Mo_xB_yN_z$ system amorphous films ($x+y+z=100$) were produced by RF magnetron sputtering method.

Firstly, a 3 mm thick Mo disc with a diameter of 100 mm was employed as a target to be sputtered and its purity was 99.95 wt. %. As source materials for B and N, 1 mm thick sintered BN plates, cut into a size of 5 mm by 5 mm, in the required number were placed onto the Mo target. An ordinary microslide glass, 1.2 mm thick, was employed as a substrate. The distance between the substrate and the target was 40 mm and the accelerating voltage applied between both electrodes was 2.5 kV. Sputtering time was determined appropriately within the range of from 10 minutes to 30 minutes, except special cases.

Figure 7:
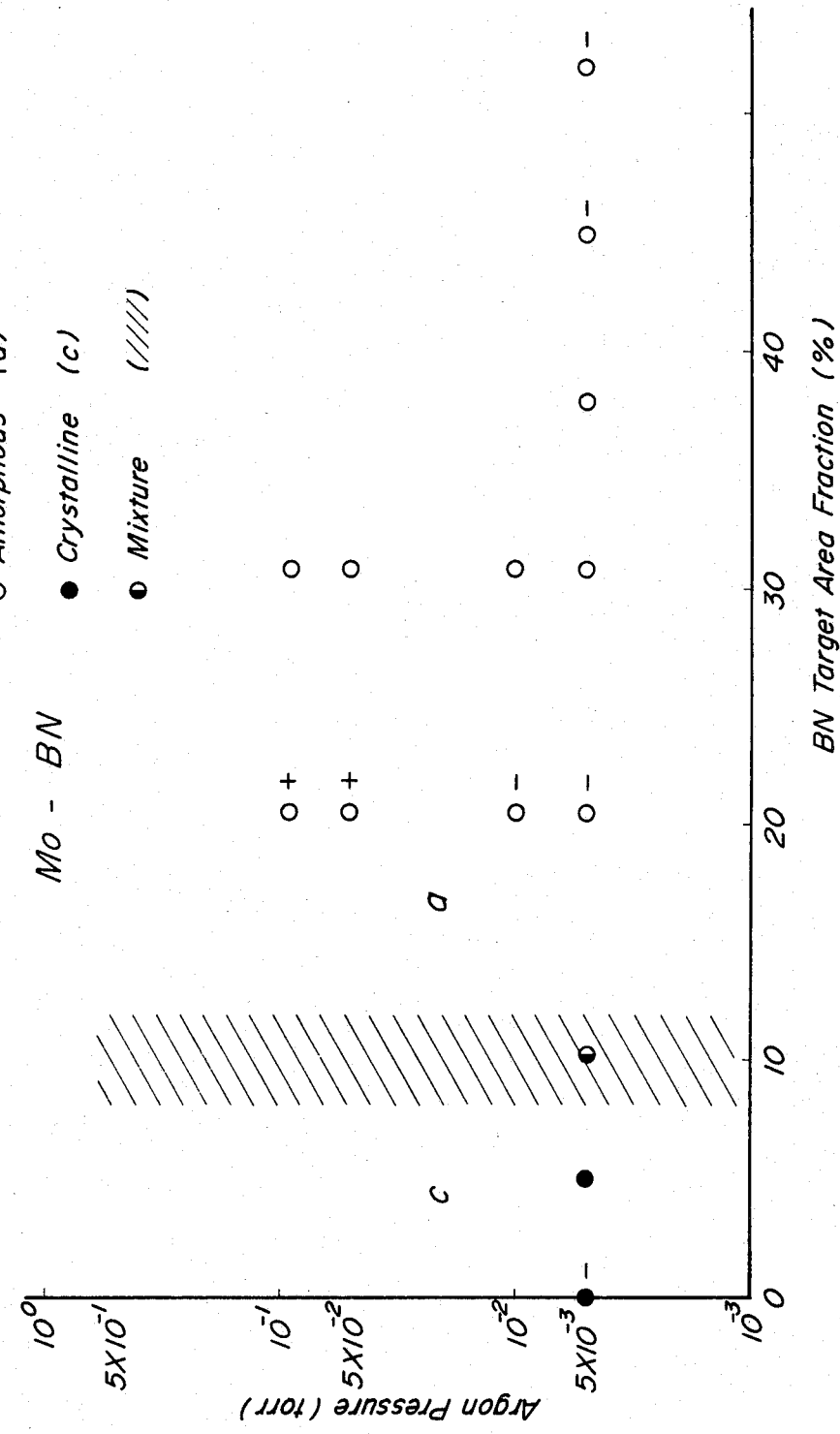
FIG. 7 is a plot of production conditions (argon pressure (PA) and BN target area fraction) for Mo-BN film.

FIG. 7 is a graph plotting process conditions in producing Mo-BN films. In this figure, the abscissa indicates the BN target area fraction (the area fraction of the BN plates to the entire area of the targets) and the ordinate indicates argon pressures, PA (torr) during sputtering.

In the region of argon pressure shown in FIG. 7, BN target area fractions exceeding 10% developed an amorphous structure in the produced films regardless of variations in PA.

Three methods were employed to distinguish between amorphous and crystalline structure. In the first method, these structure were distinguished depending upon whether a halo was ovserved in the X-ray diffraction patterns or not. The used X-ray was CuKα-ray and the halo pattern was observed in the vicinity of diffraction angle $2\theta = 40°$.

Figure 8A:
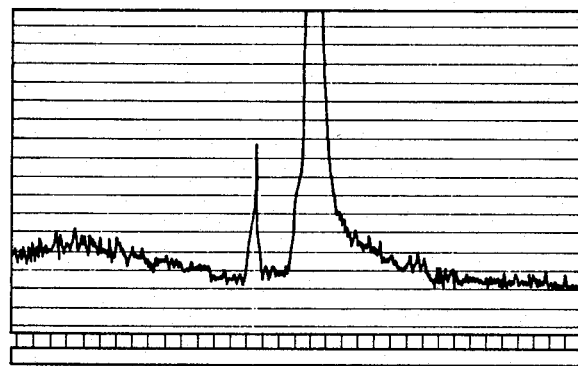
FIGS. 8(a), 8(b) and 8(c) are diffraction patterns for Mo-BN films and the respective patterns are for BN target area fractions of 0%, 10.3% and 20.5%.
Figure 8B:
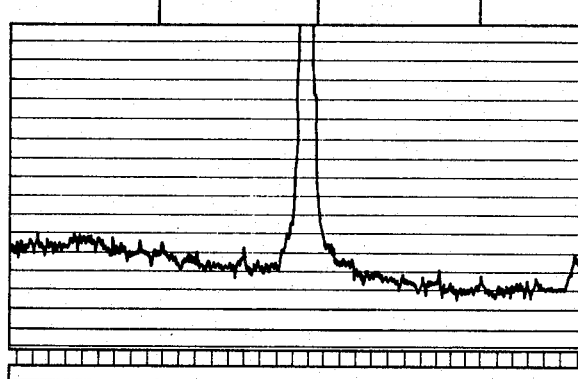
Figure 8C:
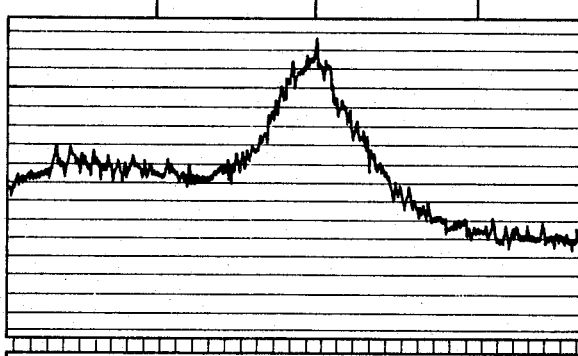

FIGS. 8(a), 8(b) and 8(c) show the diffraction patterns for BN target area fractions of 0%, 10.3% and 20.5%, respectively. The sharp peaks in the X-ray diffraction patterns of the target area fractions of 0% and 10.3% were not observed in the X-ray diffraction pattern of the target area fraction of 20.5%, but a broad diffraction pattern was. In other words, the target area fraction of 10.3% can be considered as a borderline between both structures and the lower and higher target area fraction regions than the borderline target area fraction give crystalline structure and amorphous structure, respectively.

Figure 9:
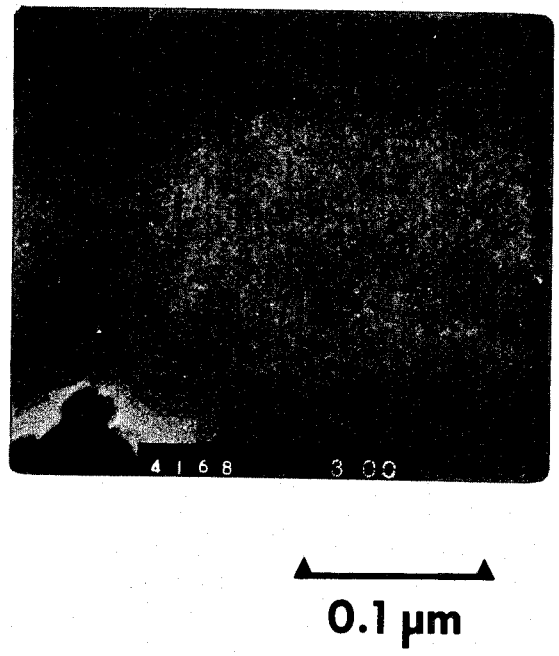
FIG. 9 is a transmission electron micrograph showing a microscopic structure of a Mo-BN specimen corresponding to a BN target area fraction of 20.5% or more.

The same results were ascertained by a second method, namely, observation by transmission electron microscopy. Specimens corresponding to a BN target area fraction of not less than 20.5% were examined under a high magnification ($\times 300{,}000$) but any indication of crystalline structure was not observed. The structure was uniform, as revealed in FIG. 9 and their electron diffraction rings were halos. Contrary to this, in the case of a specimen corresponding to the BN target ratio of 10.3%, only a mixed structure of crystalline and amorphous structures was observed. In the specimen of BN target area fraction of 0%, only a crystalline structure was detected.

As a third method, the temperature dependence of specific electrical resistivity was utilized as an assistance for structure determination. Amorphous product exhibited temperature-dependence of specific electrical resistivity much less than that of crystalline product. The results obtained on the temperature-dependence well correspond to the results of the above-mentioned observation and analysis using X-ray and transmission electron microscopy.

Figure 10:
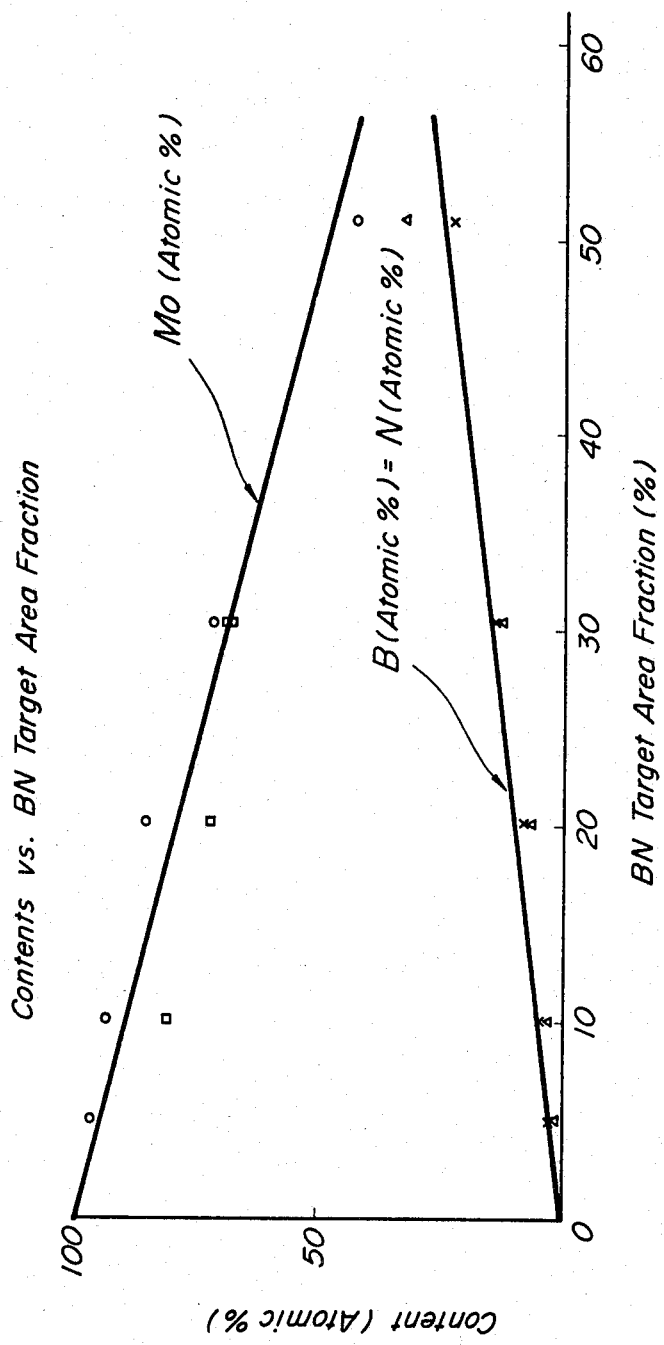
FIG. 10 is a graph showing the relationship between target area fraction and contents of B, N and Mo (all in atomic %)

The contents of Mo, B and N were determined by quantitatively analyzing the peak of AES and the results are shown by atomic % in FIG. 10. In this figure, symbols o, Δ and x represent the contents of Mo, B and N, respectively, and, further, □ is the Mo contents determined by atomic absorption method. As manifested in FIG. 10, the contents of B and N increased with increase in the BN target area fraction. The contents in the atomic percentages of Mo and B+N both vary in proportion to the Mo and BN target area fractions, respectively, and the ratio between B and N was approximately 1:1.

Figure 11:
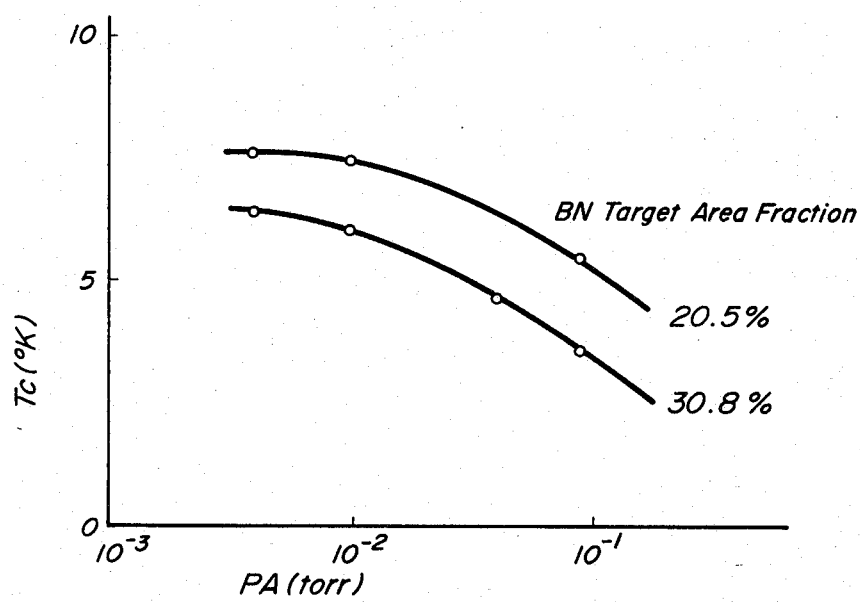
FIG. 11 is a graph plotting the relationship between transition temperature for superconductivity (Tc), and argon pressure (PA)

FIG. 11 shows the argon pressure (PA)-dependence of the transition temperature (Tc) for superconductivity for BN target area fractions of 20.5% and 30.8%. In both BN target area fractions, Tc was highest at $PA = 5 \times 10^{-2}$ torr. Unless otherwise specified, Mo-BN films exemplified hereinbelow were all produced at $PA = 5 \times 10^{-2}$ torr and an accelerating voltage of 2.5 kV.

Figure 12:
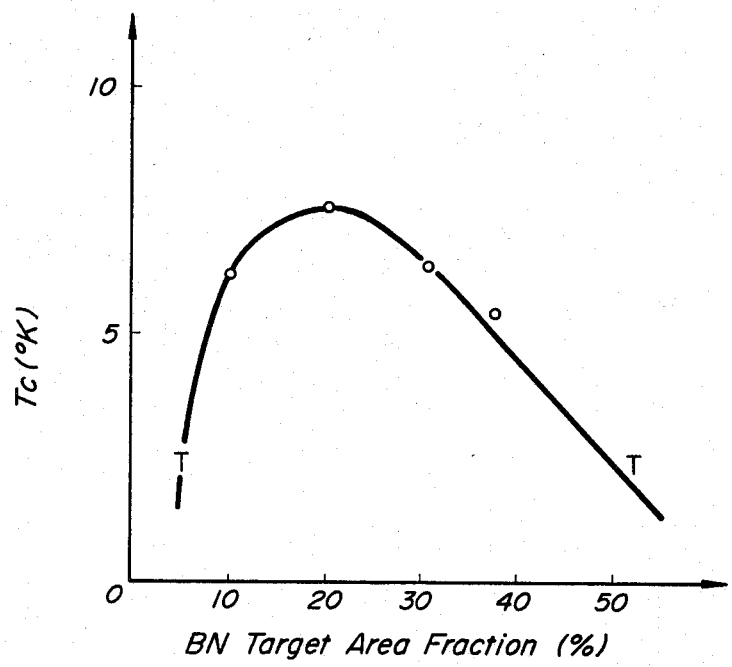
FIG. 12 is a graph showing the relationship between Tc and BN target area fraction.

FIG. 12 illustrates the dependence of Tc on the BN target area fraction (%). In this figure, a highest temperature of 7.6° K. is shown at a target area fraction of 20.5% and, when produced with this target area fraction, the superconducting film was amorphous, as can be seen from FIG. 7.

Figure 13:
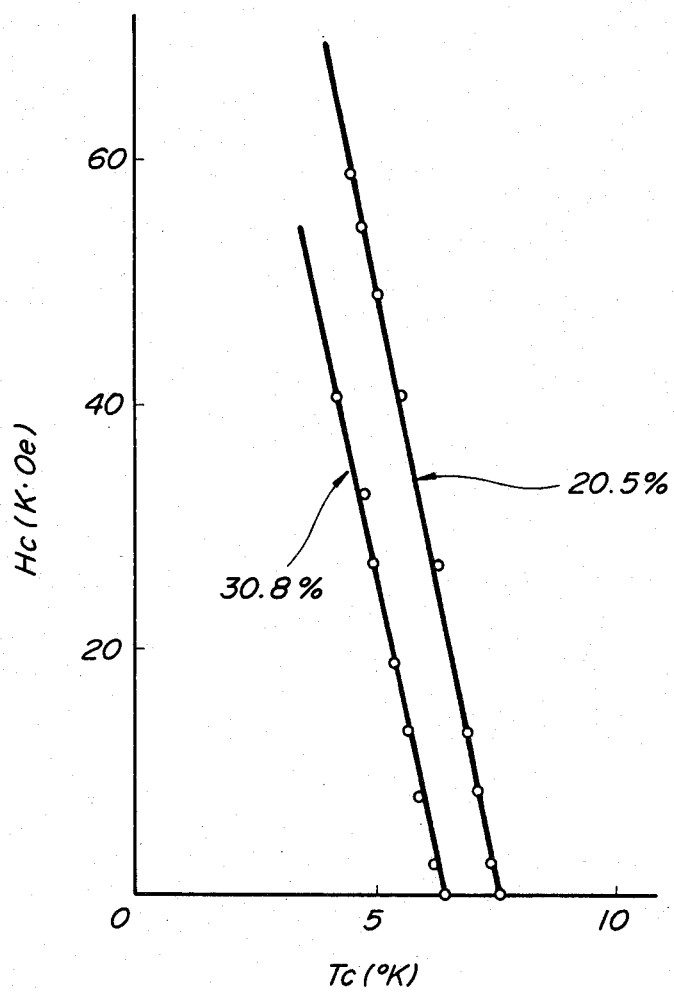
FIG. 13 is a graph showing the relationship between Tc and critical magnetic field (Hc)

FIG. 13 is a plot of the dependence of critical magnetic field (Hc) on transition temperature (Tc) for Mo-BN superconducting amorphous films in both cases of the BN target area fractions of 20.5% and 30.5%. The direction of the magnetic field was perpendicular to the films and, as shown in FIG. 13, very high Hc inherent in amorphous substances was confirmed.

Figure 14:
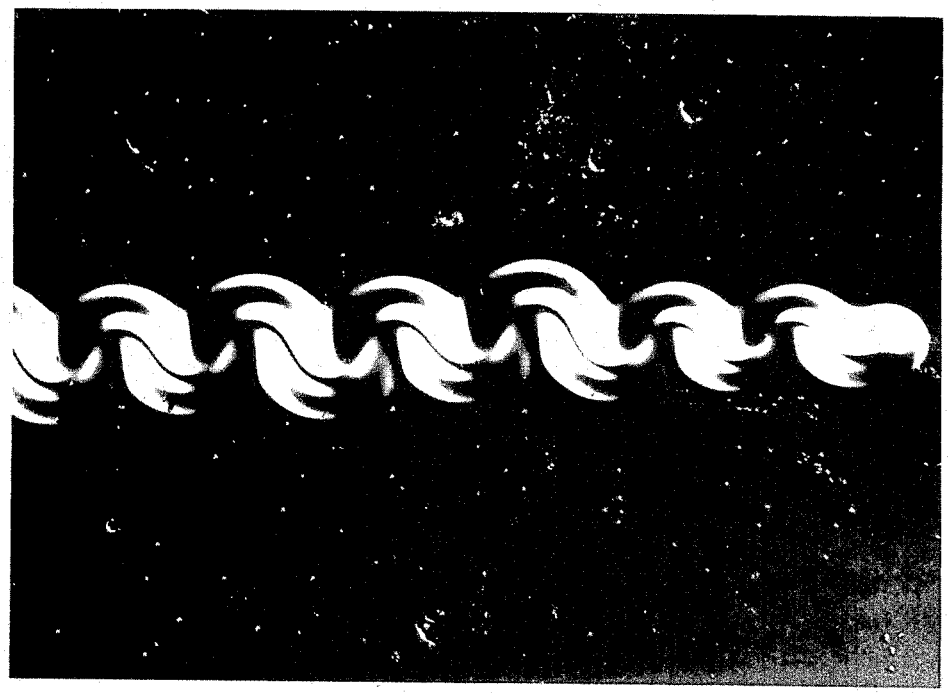
FIG. 14 is an optical microscopic graph of Mo-BN film when produced at a lower argon pressure.

In the case of forming Mo-BN films under lower argon pressures by the magnetron sputtering method, the formed films peeled off from the substrate due to compressive stress caused therein and, in this case, unique wave-shaped patterns of stress relaxation were observed through an optical microscope, as shown in FIG. 14.

On the other hand, in the case of higher argon pressures, stress in the formed films was detected as tensile stress and the stress relaxation was accompanied by cracks or fissures of the films. Stress caused in the formed films can be judged as compressive (−) or tensile (+) type depending upon whether the stress relaxation patterns are wave shape or cracks. The symbols, + and −, shown in FIG. 7 represent these two types of stresses observed. The Mo-BN film which was formed using the BN target area fraction of 20.5% and exhibited the highest superconducting transition temperature (Tc) changed the sign of the stress caused therein at PA of approximately $10^{-2}$ torr. In other words, the BN target ratio of 20.5% provided superior Mo-BN films free from stress at the argon pressure of about $10^{-2}$ torr.

Further, whether cracks are observed along the edge of the wave-shaped pattern or not relates to toughness. In the cases of the BN target area fractions of 10.3% and 51.9%, cracks were observed in the formed Mo-BN films, whereas referring to the BN target area fraction of 20.5%, any crack was not detected and the formed Mo-BN films were found to show an excellent toghness.

The Mo-BN films mentioned above were changed neither in their transition temperature (Tc) of superconductivity nor in chemical properties after being left for a half-year at room temperature. Measurements at low temperatures could not keep the film surfaces free from water but any deterioration due to the adherence of water was not detected in the films.

EXAMPLE 3

Further, NbxByNz amorphous films were produced under the same sputtering conditions as specified in Example 2, except using a Nb target disc instead of the Mo target. Distinction between amorphous and crystalline was made depending upon whether or not a halo was observed in X-ray diffraction patterns. BN target area fraction up to 10.3% provided crystalline structure and BN target area fractions of 20.5% and 30.8% provided amorphous structure.

Figure 15:
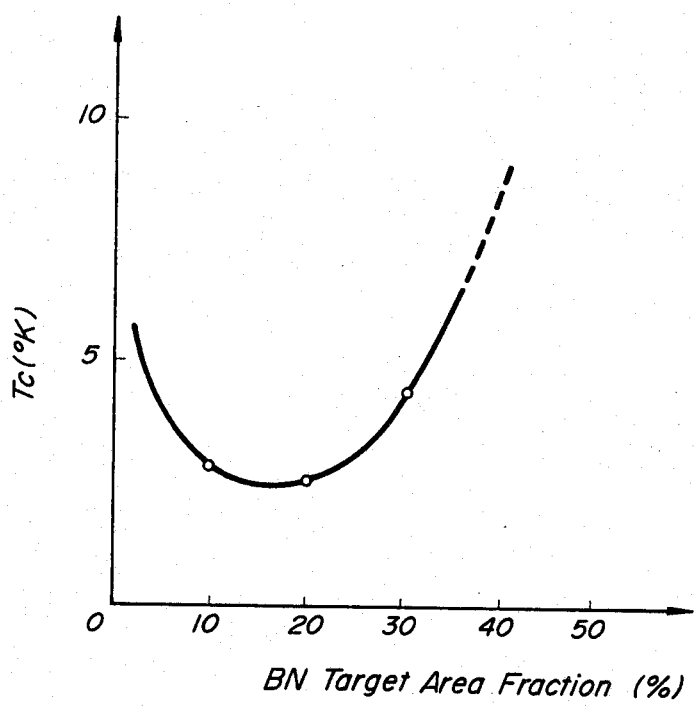
FIG. 15 is a graph showing the relationship between Tc and BN target area fraction for Nb-BN films.

The transition temperature of superconductivity, Tc, was measured on the Nb-BN films produced at an argon pressure PA=5×$10^{-2}$ torr and the dependence of Tc on BN target area fraction is shown in FIG. 15. From FIG. 15, it can be seen that the Nb-BN films have a minimum Tc between the BN target area fractions of 10.3% to 20.5% unlike the cases of the above-mentioned Mo-BN films shown in FIG. 11.

After leaving for a half year at room temperature, the produced Nb-BN films exhibited unchanged transition temperature for superconductivity and were not changed chemically. Measurements at lower temperatures could not keep the surface of the films free from water but any detrimental effect due to the adherence of water could not observed.

As described above in detail, the present invention provides amorphous alloys having a novel structure which exhibit a surprisingly superior properties as ferromagnetic materials or superconducting materials and produces such amorphous alloys without using nitrogen gas.

What is claimed is:

1. A nitrogen-containing amorphous alloy having the formula $$M_xL_yN_z$$

wherein
M is at least one metal or metal alloy,
L is B, Al, Ga, In, C, Si or Ge,
each of x, y and z is a number larger than zero, x+y+z=100 and y+z is 10 or larger,
said amorphous alloy having been prepared without using nitrogen gas, said amorphous alloy consisting essentially of first regions of an M-based amorphous phase having a low specific resistivity surrounded by second regions of LN amorphous phase having a high specific electrical resistivity.

2. An amorphous alloy as claimed in claim 1 which has been prepared by sputtering using a solid target consisting essentially of M and a solid target consisting essentially of a compound of L and N, in the absence of nitrogen gas.

3. An amorphous alloy as claimed in claim 2 in which z is at least 5 and y is not larger than 50.

4. A nitrogen-containing amorphous alloy having the formla $$M_xL_yN_z$$

wherein
M is at least one of Fe, Co, Ni or alloy thereof with at least one other metal selected from the group consisting of Sc, Ti, V, Cr, Mn, W, Mo, Ta, Nb, Zr, Cu, Ag and Au,
L is B, Al, Ga, In, C, Si or Ge,
each of x, y and z is a number larger than zero, x+y+z=100 and y+z is 10 or larger,
said amorphous alloy having been prepared without using nitrogen gas, said amorphous alloy consisting essentially of first regions of an M-based amorphous phase having a low specific resistivity surrounded by second regions of LN amorphous phase having a high specific electrical resistivity.

5. An amorphous alloy as claimed in claim 4 which has been prepared by sputtering using a first solid target consisting essentially of M and a second solid target consisting essentially of a compound of L and N, in the absence of nitrogen gas.

6. An amorphous alloy as claimed in claim 5 in which z is at least 5 and y is not larger than 50.

7. An amorphous alloy as claimed in claim 4 in which said first solid target consists essentially of Fe and said second solid target consists essentially of BN.

8. A nitrogen-containing amorphous alloy having the formula $$M_xL_yN_z$$

wherein
M is at least one of Y, Zr, Nb, Mo, Tc, Ru, Ru, Pd or alloys thereof with at least one other metal selected from the group consisting of W, Re and Os,
L is B, Al, Ga, In, C, Si or Ge,
each of x, y and z is a number larger than zero, x+y+z=100 and y+z is 10 or larger,
said amorphous alloy having been prepared without using nitrogen gas, said amorphous alloy consisting essentially of first regions of an M-based amorphous phase having a low specific resistivity surrounded by second regions of LN amorphous phase having a high specific electrical resistivity.

9. An amorphous alloy as claimed in claim 8 which has been prepared by sputtering using a first solid target consisting essentially of M and a second solid target consisting essentially of a compound of L and N, in the absence of nitrogen gas.

10. An amorphous alloy as claimed in claim 9 in which z is at least 5 and y is not larger than 50.

11. An amorphous alloy as claimed in claim 8 in which said first solid target consists essentially of Mo or Nb and said second solid target consists essentially of BN.

* * * * *

UNITED STATES PATENT AND TRADEMARK OFFICE
CERTIFICATE OF CORRECTION

PATENT NO. : 4,623,408
DATED : November 18, 1986
INVENTOR(S) : Hideaki KARAMON et al It is certified that error appears in the above-identified patent and that said Letters Patent is hereby corrected as shown below:

In the drawings, Sheet 2, Figure 2; the word "Tickness" is changed to ---Thickness---.

In the drawings, Sheet 6, Figure 6; the two occurrences of the word "Ragion" are changed to ---Region---.

Column 8, Line 55; Change "Ru" (second occurrence) to ---Rh---.

Signed and Sealed this

Fifteenth Day of December, 1987

Attest:

DONALD J. QUIGG

*Attesting Officer*     *Commissioner of Patents and Trademarks*